(12) United States Patent
Pimputkar et al.

(10) Patent No.: US 9,133,564 B2
(45) Date of Patent: Sep. 15, 2015

(54) AMMONOTHERMAL GROWTH OF GROUP-III NITRIDE CRYSTALS ON SEEDS WITH AT LEAST TWO SURFACES MAKING AN ACUTE, RIGHT OR OBTUSE ANGLE WITH EACH OTHER

(75) Inventors: Siddha Pimputkar, Goleta, CA (US); James S. Speck, Goleta, CA (US); Shuji Nakamura, Santa Barbara, CA (US); Shin-Ichiro Kawabata, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 763 days.

(21) Appl. No.: 13/283,862

(22) Filed: Oct. 28, 2011

(65) Prior Publication Data

US 2012/0164386 A1 Jun. 28, 2012

Related U.S. Application Data

(60) Provisional application No. 61/408,444, filed on Oct. 29, 2010.

(51) Int. Cl.
   *C30B 7/10* (2006.01)
   *C30B 29/40* (2006.01)

(52) U.S. Cl.
   CPC .............. *C30B 7/105* (2013.01); *C30B 29/403* (2013.01); *Y10T 428/24479* (2015.01)

(58) Field of Classification Search
   None
   See application file for complete search history.

(56) References Cited

U.S. PATENT DOCUMENTS

| | | | |
|---|---|---|---|
| 6,256,521 B1 | 7/2001 | Lee et al. | |
| 7,364,619 B2 | 4/2008 | Dwilinski et al. | |
| 2001/0007238 A1 | 7/2001 | Krempl et al. | |
| 2007/0280872 A1* | 12/2007 | Okahisa et al. | 423/409 |
| 2008/0008855 A1 | 1/2008 | D'Evelyn et al. | |
| 2008/0156254 A1 | 7/2008 | Dwilinski et al. | |
| 2009/0081857 A1 | 3/2009 | Hanser et al. | |
| 2009/0309105 A1 | 12/2009 | Letts et al. | |
| 2010/0148212 A1* | 6/2010 | Fujito et al. | 257/103 |

FOREIGN PATENT DOCUMENTS

| | | |
|---|---|---|
| CN | 101061570 | 10/2007 |
| CN | 101631902 | 1/2010 |
| JP | 2010-515655 | 5/2010 |
| WO | 2006057463 | 6/2006 |
| WO | 2008-086000 | 7/2008 |

OTHER PUBLICATIONS

PCT International Search Report for international application No. PCT/US2011/058261 filed on Oct. 28, 2011.
Extended European Search Report dated May 9, 2014 for European Patent Application No. 11837148.3.
Japanese Office Action (with English translation) dated Feb. 3, 2015 for Japanese Patent Application No. 2013-536861.
Chinese Office Action (with English translation) dated Mar. 23, 2015 for Chinese Patent Application No. 201180052574.8.

* cited by examiner

*Primary Examiner* — Guinever S Gregorio
(74) *Attorney, Agent, or Firm* — Gates & Cooper LLP (57) ABSTRACT

An ammonothermal growth of group-III nitride crystals on starting seed crystals with at least two surfaces making an acute, right or obtuse angle, i.e., greater than 0 degrees and less than 180 degrees, with respect to each other, such that the exposed surfaces together form a concave surface.

31 Claims, 5 Drawing Sheets

AMMONOTHERMAL GROWTH OF GROUP-III NITRIDE CRYSTALS ON SEEDS WITH AT LEAST TWO SURFACES MAKING AN ACUTE, RIGHT OR OBTUSE ANGLE WITH EACH OTHER

CROSS REFERENCE TO RELATED APPLICATION

This application claims the benefit under 35 U.S.C. Section 119(e) of the following co-pending and commonly-assigned application:

U.S. Provisional Patent Application Ser. No. 61/408,444, filed on Oct. 29, 2010, by Siddha Pimputkar, James S. Speck, Shuji Nakamura, and Shin-ichiro Kawabata, entitled "AMMONOTHERMAL GROWTH OF GROUP-III NITRIDE CRYSTALS ON SEEDS WITH AT LEAST TWO SURFACES MAKING AN ACUTE OR OBTUSE ANGLE WITH EACH OTHER,";

which application is incorporated by reference herein.

BACKGROUND OF THE INVENTION

1. Field of the Invention

The invention is related to the ammonothermal growth of group-III nitride crystals on seeds with at least two surfaces making an acute, right or obtuse angle with each other.

2. Description of the Related Art

Ammonothermal growth of group-III nitrides, for example, gallium nitride (GaN), involves placing, within a reactor vessel, group-III containing source material, group-III nitride seed crystals, and a nitrogen-containing fluid or gas, such as ammonia, then sealing the vessel and heating the vessel to conditions, such that the reactor is at elevated temperatures (between 23° C. and 1000° C.) and high pressures (between 1 atm and, for example, 30,000 atm). Under these temperatures and pressures, the nitrogen-containing fluid becomes a supercritical fluid and normally exhibits enhanced solubility of group-III nitride material into solution.

The solubility of group-III nitride into the nitrogen-containing fluid is dependent on the temperature, pressure and density of the fluid, among other things. By creating two different zones within the vessel, it is possible to establish a solubility gradient where the solubility in a first zone will be higher than the solubility in a second zone. The source material is then preferentially placed in the higher solubility first zone and the seed crystals in the lower solubility second zone. By establishing fluid motion between these two zones, for example, by making use of natural convection, it is possible to transport group-III nitride material from the higher solubility first zone to the lower solubility second zone where it then deposits itself onto the seed crystals.

Currently, when growing group-III nitride crystals using the ammonothermal method, it may be possible that the growth along one crystallographic direction is slower than along another crystallographic direction. What may be seen when growing, for example, GaN, is that the growth rate along the polar c-direction {0001} is approximately four to ten times faster than along a perpendicular, stable, non-polar direction, such as the m-direction {10-10}. Additionally, the absolute growth rate along the stable, non-polar direction may be relatively small, on the order of 10-50 µm/day. In order to fabricate substrates from bulk group-III nitride crystals, it is desirable to obtain the highest possible growth rates, while still maintaining crystal quality.

If it is desired to produce substrates which have a large non-polar and/or semi-polar surface, it is desirable to have rapid growth rates along the c-direction, but also along a perpendicular non-polar direction. It has been observed that growth in the non-polar a-direction {11-20}, which is perpendicular to both the m-direction and c-direction, can be up to 10 times faster than the m-direction. Additionally, the a-plane typically grows out of existence and multiple m-plane facets form, replacing the original a-plane surface of the seed.

In addition to improving on the overall growth rate of the crystal, it is important to control the uptake of chemical species. Unless a perfectly pure environment exists during growth, which is never the case, chemicals present in the growth chamber will be incorporated into the growing GaN crystal. These chemicals may modify the properties of the crystals in a good way (e.g. dopants to improve on the free carrier concentrations, etc.) or a bad way (e.g. impurities reducing overall carrier lifetime or optical properties by introducing electronic states within the band gap of the crystal, etc.).

Currently, once a crystal of a certain size is obtained, the surfaces that grow in steady state are typically m-plane {10-10} and c-plane {0001} (although occasionally, the {10-11} or {10-1-1} planes are also seen). The uptake of chemicals along these planes is dominated by the interface between the crystal and the environment and, since only a limited number of stable planes emerge (e.g., m- and c-planes), the uptake of chemicals in the resulting crystal will be dominated by the uptake of chemicals on the m- and c-planes.

What is needed, then, is an improved method of fabricating III-nitride-based crystals that solves or reduces these problems. The present invention satisfies this need.

SUMMARY OF THE INVENTION

To overcome the limitations in the prior art described above, and to overcome other limitations that will become apparent upon reading and understanding the present specification, the present invention discloses an ammonothermal growth of group-III nitride crystals on starting seed crystals with at least two surfaces making an acute, right or obtuse angle, i.e., greater than 0 degrees and less than 180 degrees, with respect to each other, such that the exposed surfaces together form a concave surface.

BRIEF DESCRIPTION OF THE DRAWINGS

Referring now to the drawings in which like reference numbers represent corresponding parts throughout:

FIG. 2b illustrates the regrowth of both the seed crystal and cut-out portion of FIG. 2a.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention arranges two or more adjacent exposed crystallographic planes (i.e., surfaces) of one or more group-III nitride crystals with respect to each other, thereby allowing these planes to grow in steady-state using the ammonothermal method. The angle between the two adjacent exposed surfaces preferably is greater than 0 degrees and less than 180 degrees, i.e., either acute, 90 degrees (right) or obtuse, thereby reducing, if not eliminating, the possibility of a third, slower growing plane emerging.

Typically, during bulk crystal growth, the slowest growing planes eventually overtake other faster growing planes to produce the habit of the crystal. The present invention provides a means to prevent this from happening.

By providing a means for steady state growth of a group-III nitride crystal on different planes, it is possible to select one or more desired growth planes in order to modify growth rates, uptake of chemical species, generation of defects, crystal quality, optical, electrical, and magnetic properties of the growing group-III nitride crystal. Additionally, this invention provides the means to quickly generate multiple large group-III nitride crystals, and generate large group-III nitride crystals given multiple smaller group-III nitride crystals.

Thus, the present invention provides for the following:

a) Increase overall growth rate and increase mass of crystals using ammonothermal or solvothermal methods, allowing for increased efficiency and lower cost generation of substrates for use in the electronic/optoelectronic markets;

b) Improved crystal quality by growing laterally from the crystal at sustained growth rates;

c) Improved curvature (i.e. decrease the curvature) of the crystallographic planes of the crystal by growing laterally;

d) Create crystals of different chemical compositions, impurity concentrations and doping concentrations;

e) Modify the uptake of chemical species, which may be considered impurities, doping agents or alloying elements;

f) Modify the optical, electrical, magnetic properties of the crystals through controlling uptake of chemical species and/or controlling the formation of defects; and g) Modify the generation or incorporation of defects within the growing crystal, wherein the defects may be point, line, extended, planar or volume defects;

h) Seed multiplication, i.e. when one high quality seed of a certain size is available, multiple seeds of identical size can be rapidly produced.

Technical Description

The present invention improves on the existing state of the art by enabling the continued, steady state growth of single GaN crystals on planes that are different than the resulting steady state facets seen in the ammonothermal growth of single GaN crystals. This is done by geometrically modifying the initial starting seed crystal or seed crystals to include at least two surfaces that make an angle greater than 0 degrees and less than 180 degrees with respect to each other, i.e., an angle that is either acute, 90 degrees (right) or obtuse.

FIGS. 1-4 illustrate the growth of seed crystals, wherein the c-direction is orthogonal to the drawing sheet and thus FIGS. 1-4 each provide a projection view looking down on a c-plane surface of the seed crystals. The arrows in these figures indicate the growth direction. Note, however, that growth would also occur long the c-plane, i.e., orthogonally in and out of the drawing sheet.

Figure 1A:
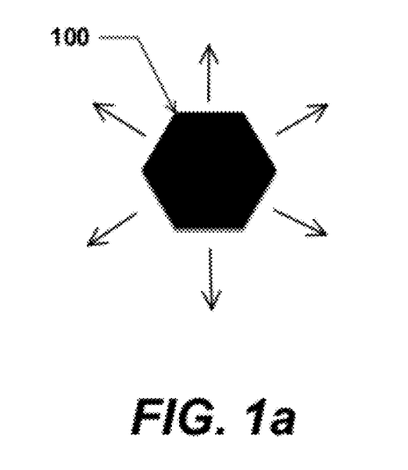
FIG. 1a illustrates the typical growth of a typical seed crystal.

FIG. 1a illustrates the typical growth of a typical seed crystal 100, wherein steady state, slow growing, m-plane facets emerge and grow as indicated by the arrows, with a slow growth rate.

Figure 1B:
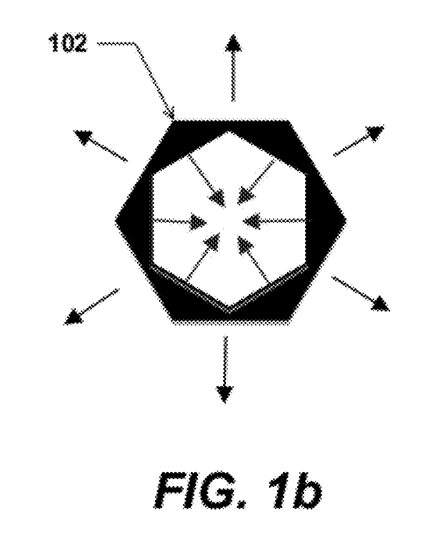
FIG. 1b illustrates the growth of a seed crystal according to the present invention.

FIG. 1b illustrates the growth of a seed crystal 102 according to the present invention, wherein, like FIG. 1a, the arrows on the outside of the crystal 102 indicate that steady state, slow growing, m-plane facets emerge and grow with a slow growth rate. However, FIG. 1b differs from FIG. 1a in that a center portion of the seed crystal 102 has been cut out, resulting in an annulus structure, and a-plane facets have been exposed on the inside of the seed crystal 102. The arrows on the inside of the crystal 102 also indicate the growth direction, wherein the a-plane facets would grow out of existence in the typical growth mode, with a fast growth rate, i.e., the growth rates of the a-plane facets on the inside of the crystal 102 are faster than the growth rate of the m-plane facets on the outside of the crystal 102. Note that the a-plane facets on the inside of the crystal 102 remain stable, since these facets are concave and not convex as is the case for the m-plane facets on the outside of the crystal 102. Thus, FIG. 1b illustrates the increased growth rates and stable steady state growth on planes not typically considered stable (i.e., fast growing planes).

Figure 2A:
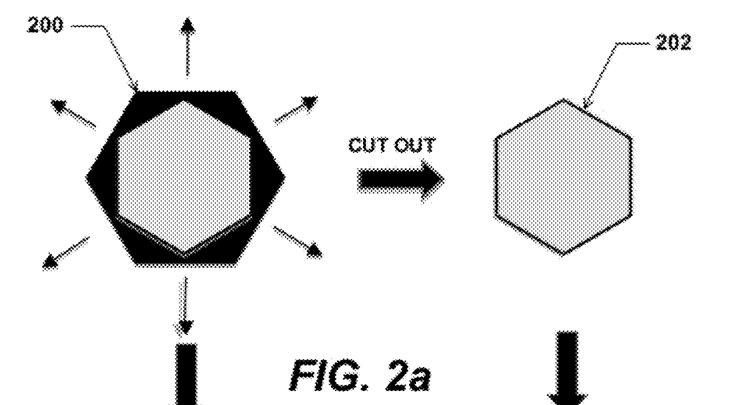
FIG. 2a illustrates how the inside of the seed crystal has been cut out according to the present invention, wherein the cut-out portion of the seed may also be used for growth.

FIG. 2a illustrates the how the center portion of the seed crystal 200 has been cut out, resulting in an annulus structure for the seed crystal 200, according to the present invention, wherein the cut-out portion 202 of the seed crystal 200 may also be used for growth. In FIG. 2a, the a-plane facets on the outside of the cut-out portion 202 are exposed.

Figure 2B:
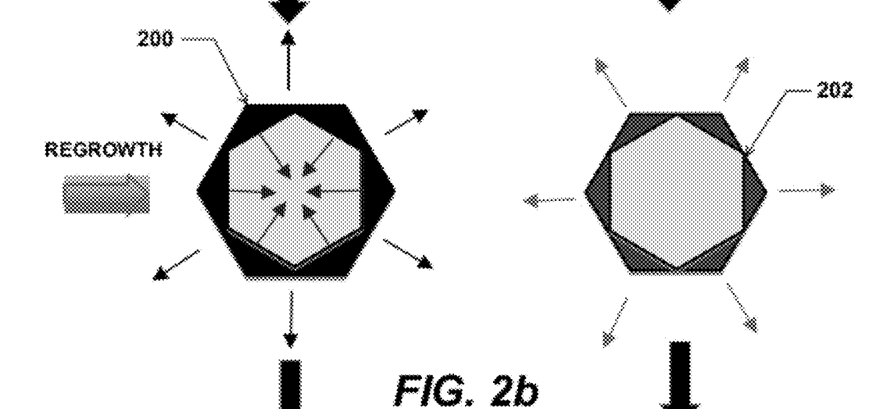

FIG. 2b illustrates the regrowth of both the annulus structure of the seed crystal 200 and cut-out portion 202 of FIG. 2a. The regrowth of the seed crystal 200 in FIG. 2b is similar to that shown in FIG. 1b. Moreover, the regrowth of the cut-out portion 202 shows that the fast growing a-plane facets grow out of existence, and are replaced by steady state, slow growing m-plane facets, thereby rapidly expanding the cut-out portion 202 by the additional area.

Figure 2C:
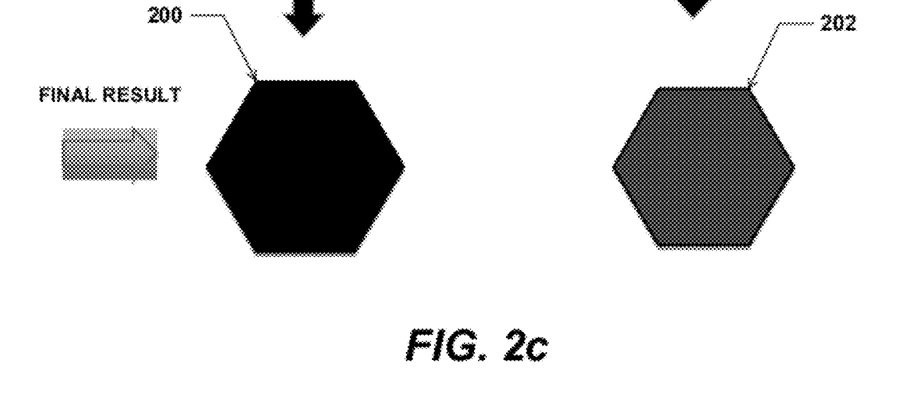
FIG. 2c illustrates the results of the regrowth of both the seed crystal and cut-out portion in FIG. 2b.

FIG. 2c illustrates the final results of the regrowth of both the annulus structure of the seed crystal 200 and the cut-out portion 202 in FIG. 2b. Specifically, the regrowth results in seed crystal multiplication, because the regrowth performed on both the annulus structure of the seed crystal 200 and the cut-out portion 202 now occurs many times faster, as fast growing planes are exposed (e.g. the a-plane facets, or {11-22}, or others), with the end result of the regrowth being two complete seed crystals 200, 202, without an annulus structure or cut-out center portion, with comparable properties, and of similar size.

It also noted that seed crystals may be defective, with defects running along the c-axis, or potentially at an angle to the c-axis. Additionally, depending on the method used to fabricate the seed crystal, it is possible that multiple grains are present which are structurally speaking, columns propagating along the c-direction with varying tilt and twist among each other. These are illustrated in the cross-sectional side view of a crystal 300 shown in FIG. 3a, wherein the interior lines of the crystal 300 represent defects and/or columns.

Figure 3A:
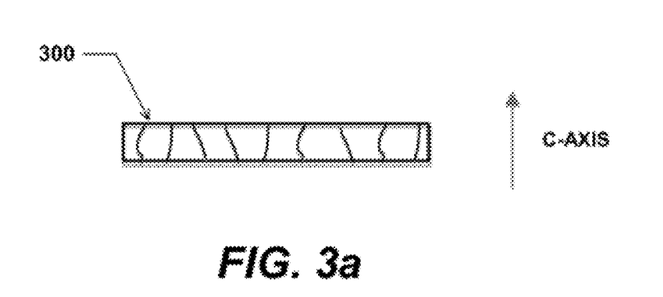
FIG. 3a illustrates the direction of defects found in seed crystals.

With the present invention, growth will primarily occur along directions that are at an angle to the c-axis, ideally perpendicular. By doing so, it is possible to limit or prevent the propagation of the defects into the newly grown crystal. Additionally, by growing perpendicular to the c-direction, it is possible to reduce the concentration of grains within the crystal.

Figure 3B:
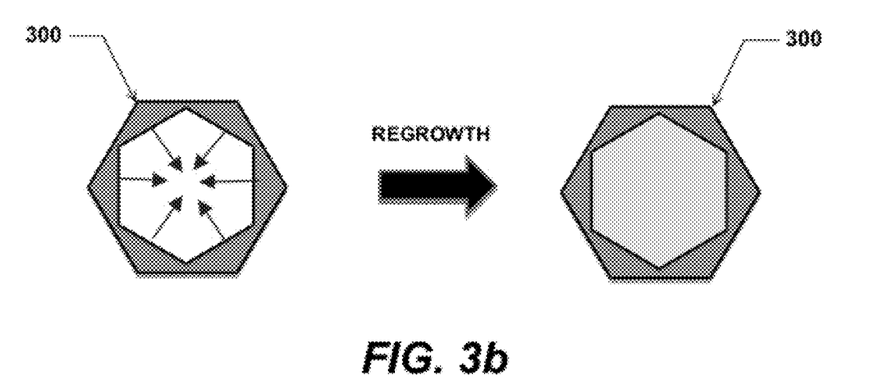
FIG. 3b shows how the annulus of the seed crystal may be highly defective, while the regrown center of the seed crystal is less defective, and of better quality.

For example, in the regrowth performed on the seed crystal 300 of FIG. 3b, following a cut-out of a center portion of the seed crystal 300 resulting in an annulus structure for the seed crystal 300, the annulus structure of the seed crystal 300 may be highly defective with grains and other defects such as dislocations. (Generally, such defects would propagate primarily out of or into the c-plane, namely orthogonal to the plane of the drawing sheet.) Following regrowth, however, the regrown area in the center portion of the annulus structure of the seed crystal 300 is less defective and of better quality.

Moreover, this process (cutting out the center portion of the crystal and then performing a regrowth) can be repeated multiple times to further reduce defects, e.g. reduce dislocation density. Additionally, the center portion of the newly regrown seed crystal will have the lowest defect density, and this center portion can be cut out and used as a source of an almost perfect crystal for future growth, as shown previously in FIGS. 2a, 2b and 2c.

Figure 4:
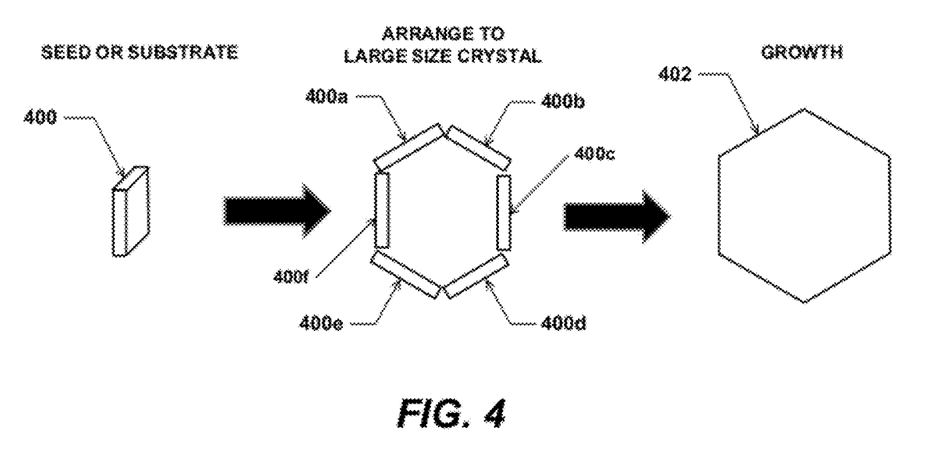
FIG. 4 illustrates how rectangular portions or slabs of seeds or substrates can be arranged to create a large size seed crystal.

Additionally, while it has been shown that the annulus structure is created by cutting out the center of the seed crystal, and thus is comprised of one continuous crystal, it is possible to create an annulus structure in other ways as well. For example, FIG. 4 illustrates how rectangular portions or slabs 400 of seeds or substrates can be arranged, as shown by 400a, 400b, 400c, 400d, 400e, 400f, to create a large size seed crystal having an annulus structure, wherein at least two of these portions or slabs 400 are positioned at an angle that is greater than 0 degrees and less than 180 degrees, with respect to each other. The growth of these arranged rectangular portions or slabs 400 of seeds or substrates towards the center of the annulus structure eventually results in a complete seed crystal 402 without an annulus structure.

Generally, it can be said that the best method of applying this invention involves the use of an initial seed crystal that has at least two exposed surfaces that make an angle that is greater than 0 degrees and less than 180 degrees with respect to each other. In some cases, it is preferable that they make exactly 60 degrees in order to take advantage of crystal symmetry (e.g. when growing along the a-planes). In other cases, it may be preferable to have a larger angle to allow for six {11-22} planes to grow towards each other inside the annulus structure. Since the two rapidly growing planes face each other, it is not possible for a slower growing steady state facet to emerge as it would be immediately incorporated through the advancing growth from of the faster growing planes. This property is created by the fact that the facets grow towards each other as opposed to away from each other, as is the case on the outside of the annulus.

Since it is now possible to maintain steady state growth of faster growing planes, it is possible to optimize the geometry of the seed to take advantage of the varying incorporation of different chemicals. This should allow of increased purity by reducing impurity incorporation, improved conductivity of the crystals through increased doping concentrations, reduced absorption loss by controlling non-stoichiometric growth (formation of vacancies or anti-site defects).

Process Steps

Figure 5:
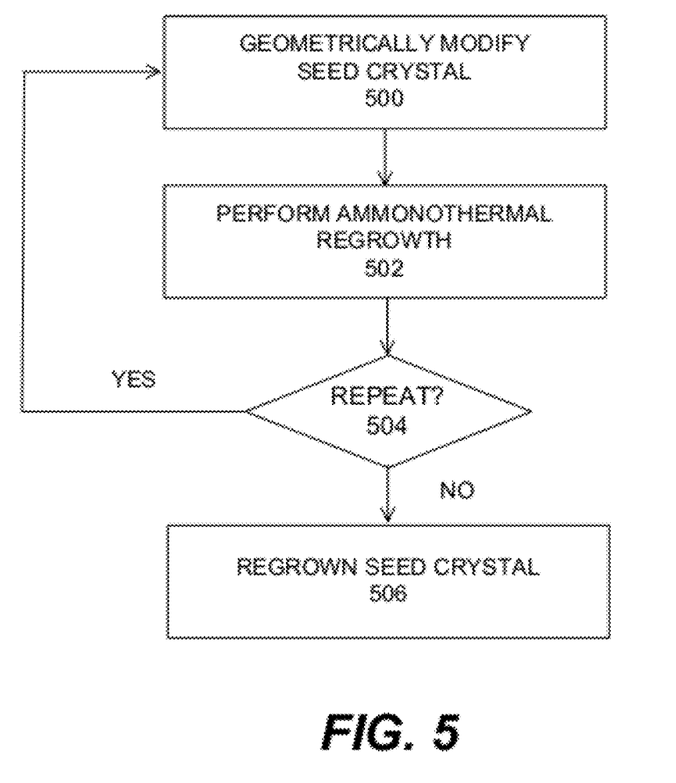
FIG. 5 is a flowchart that illustrates a method for fabricating a crystal according to the present invention.

FIG. 5 is a flowchart that illustrates a method for fabricating a crystal comprising a group-III nitride crystal that is grown on at least one group-III seed crystal that has at least two exposed surfaces that make an angle that is greater than 0 degrees and less than 180 degrees, i.e., is either acute, 90 degrees (right) or obtuse, with respect to each other.

Block 500 represents geometrically modifying one or more starting seed crystals to include at least two exposed surfaces that make an angle greater than 0 degrees and less than 180 degrees with respect to each other, wherein the starting seed crystals comprise group-III seed crystals, such as GaN seed crystals.

Note that the two exposed surfaces that make an angle greater than 0 degrees and less than 180 degrees with respect to each other together comprise a concave surface. The concave surface may be of any shape or any form, with any desired amount of curvature. Moreover, the concave surface need not be planar or continuous.

This geometric modification of the starting seed crystals may be done, for example, by forming an annulus structure by cutting out the center portion of the starting seed crystal, resulting in exposed surfaces that make an angle greater than 0 degrees and less than 180 degrees with respect to each other. In another example, the annulus structure may be created using rectangular portions or slabs of seeds or substrates arranged to create the starting crystal having an annulus structure, also resulting in exposed surfaces that make an angle greater than 0 degrees and less than 180 degrees with respect to each other. In yet another example, the cut-out center portion of the seed crystal may itself provide these exposed surfaces that make an angle greater than 0 degrees and less than 180 degrees with respect to each other.

In one embodiment, the annulus structure is comprised of a-plane facets as growth facets. Specifically, the annulus structure is comprised of multiple, identical or different facets, including, but not limited to, {11-22}, {11-20}, {10-11}, {10-1-1}, {11-21}, {11-2-2}, {11-2-1} facets upon which the growth occurs.

Block 502 represents performing an ammonothermal regrowth of the geometrically modified seed crystals, resulting in a newly regrown seed crystal via coalescence, wherein growth of the seed crystals primarily occurs along directions that are at an angle to the c-axis (preferably substantially perpendicular to the c-axis), such that fast growing a-plane facets eventually coalesce and grow out of existence, and the fast growing a-plane facets are replaced by steady state, slow growing m-plane facets, thereby rapidly expanding the geometrically modified seed crystals.

Block 504 is a decision block that determines whether Blocks 500 and 502 are to be repeated. Note that the steps of Blocks 500 and 502 can be repeated multiple times to further reduce defects, e.g. reduce dislocation density. Additionally, the newly regrown seed crystal can be used as a source of another iteration of the process, i.e., the starting seed crystal.

Finally, Block 506 represents the end result of the process, namely a newly regrown group-III nitride seed crystal. The newly regrown group-III nitride seed crystal grown in this manner exhibit a number of properties different from those exhibited by the starting seed crystals, including:

- a different concentration of defects, impurities, or chemical species, such as Si, Mg, Al, In, Fe,
- a lower concentration of defects, such as dislocations, vacancies, volume defects, or stacking faults,
- a lower concentration of chemicals or chemical compounds, such as oxygen, transition metals, carbon, alkali metals, alkali earth metals, or halogens,
- a higher concentration of chemicals or chemical compounds, such as Si or Mg,
- a higher concentration of free carriers, comprising electrons or holes, a lower concentration of free carriers, comprising electrons or holes,
a better absorption coefficient for at least one wavelength,
a larger radius of curvature for certain crystallographic planes,
a higher crystal quality than the seed crystals,
fewer grains, and
a larger growth rate after extended growth in the same environment.

Possible Modifications and Variations

Many modifications and variations for this invention are possible. Although this invention is described as using an ammonthermal method, other bulk crystal growth techniques may be used as well. For example, flux-based techniques may be used, such as a sodium flux method.

Nomenclature

The terms "nitride," "III-nitride," or "group-III nitride," as used herein refer to any alloy composition of the (Al,B,Ga,In)N semiconductors having the formula $Al_wB_xGa_yIn_zN$ where $0 \leq w \leq 1$, $0 \leq x \leq 1$, $0 \leq y \leq 1$, and $0 \leq z \leq 1$. These terms are intended to be broadly construed to include respective nitrides of the single species, Al, B, Ga, and In, as well as binary, ternary and quaternary compositions of such group III metal species. Accordingly, it will be appreciated that the discussion of the invention hereinafter in reference to GaN and InGaN materials is applicable to the formation of various other (Al,B,Ga,In)N material species. Further, (Al,B,Ga,In)N materials within the scope of the invention may further include minor quantities of dopants and/or other impurity or inclusional materials.

Many III-nitride devices are grown along the polar c-plane of the crystal, although this results in an undesirable quantum-confined Stark effect (QCSE), due to the existence of strong piezoelectric and spontaneous polarizations. One approach to decreasing polarization effects in III-nitride devices is to grow the devices on non-polar or semi-polar planes of the crystal.

The term "non-polar plane" includes the {11-20} planes, known collectively as a-planes, and the {10-10} planes, known collectively as m-planes. Such planes contain equal numbers of group-III (e.g., gallium) and nitrogen atoms per plane and are charge-neutral. Subsequent non-polar layers are equivalent to one another, so the bulk crystal will not be polarized along the growth direction.

The term "semi-polar plane" can be used to refer to any plane that cannot be classified as c-plane, a-plane, or m-plane. In crystallographic terms, a semi-polar plane would be any plane that has at least two nonzero h, i, or k Miller indices and a nonzero l Miller index. Subsequent semi-polar layers are equivalent to one another, so the crystal will have reduced polarization along the growth direction.

Miller indices are a notation system in crystallography for planes and directions in crystal lattices, wherein the notation {hikl} denotes the set of all planes that are equivalent to (hikl) by the symmetry of the lattice. Specifically, the use of braces, { }, denotes a family of symmetry-equivalent planes represented by parentheses, ( ) wherein all planes within a family are equivalent for the purposes of this invention.

REFERENCES

The following reference is incorporated by reference herein:
1. U.S. Patent Application Publication No. 2008/0156254, published Jul. 3, 2008, by Dwilinski, and entitled "Nitride Single Crystal Seeded Growth in Supercritical Ammonia with Alkali Metal Ion."

CONCLUSION

This concludes the description of the preferred embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A crystal, comprising:
at least one starting group-III nitride seed crystal that has a center portion cut out to create an annulus structure that has at least two exposed surfaces that make an angle greater than 0 degrees and less than 180 degrees with respect to each other, wherein growth occurs on facets both inside and outside of the annulus structure, resulting in a group-III nitride crystal grown on the starting group-III nitride seed crystal.

2. The crystal of claim 1, wherein the exposed surfaces form a concave surface.

3. The crystal of claim 1, wherein the exposed surfaces are a-plane facets of the annulus structure.

4. The crystal of claim 1, wherein the exposed surfaces are {11-22}, {11-20}, {10-11}, {10-1-1}, {11-21}, {11-2-2}, or {11-2-1} facets of the annulus structure.

5. The crystal of claim 1, wherein the exposed surfaces are coalesced in the group-III nitride crystal.

6. The crystal of claim 1, wherein there are a plurality of starting group-III nitride seed crystals, each of the starting group-III nitride seed crystals having an exposed surface, and the starting group-III nitride seed crystals are arranged such that exposed surfaces of adjacent ones of the starting group-III nitride seed crystals make an angle greater than 0 degrees and less than 180 degrees with respect to each other.

7. The crystal of claim 1, wherein the group-III nitride crystal contains a different concentration of defects than the starting group-III nitride seed crystal.

8. The crystal of claim 1, wherein the group-III nitride crystal contains a different concentration of impurities than the starting group-III nitride seed crystal.

9. The crystal of claim 1, wherein the group-III nitride crystal contains a different concentration of chemical species than the starting group-III nitride seed crystal.

10. The crystal of claim 1, wherein the group-III nitride crystal has a different concentration of free carriers than the starting group-III nitride seed crystal.

11. The crystal of claim 1, wherein the group-III nitride crystal has a different absorption coefficient for at least one wavelength than the starting group-III nitride seed crystal.

12. The crystal of claim 1, wherein the group-III nitride crystal has a larger radius of curvature for certain crystallographic planes than the starting group-III nitride seed crystal.

13. The crystal of claim 1, wherein the group-III nitride crystal has a higher crystal quality than the starting group-III nitride seed crystal.

14. The crystal of claim 1, wherein the group-III nitride crystal has fewer grains than the starting group-III nitride seed crystal.

15. The crystal of claim 1, wherein the group-III nitride crystal is grown with a larger growth rate than the starting group-III nitride seed crystal after extended growth in the same environment.

16. A method of creating a crystal, comprising:
growing on at least one starting group-III nitride seed crystal that has a center portion cut out to create an annulus structure that has at least two exposed surfaces that make an angle greater than 0 degrees and less than 180 degrees with respect to each other, wherein growth occurs on facets both inside and outside of the annulus structure, resulting in a group-III nitride crystal grown on the starting group-III nitride seed crystal.

17. The method of claim 16, wherein the group-III nitride crystal is produced using an ammonothermal, flux or other bulk crystal growth technique.

18. The method of claim 16, wherein the exposed surfaces form a concave surface.

19. The method of claim 16, wherein the exposed surfaces are a-plane facets of the annulus structure.

20. The method of claim 16, wherein the exposed surfaces are {11-22}, {11-20}, {10-11}, {10-1-1}, {11-21}, {11-2-2}, or {11-2-1} facets of the annulus structure.

21. The method of claim 16, wherein the exposed surfaces are coalesced in the group-III nitride crystal.

22. The method of claim 16, wherein there are a plurality of starting group-III nitride seed crystals, each of the starting group-III nitride seed crystals having an exposed surface, and the starting group-III nitride seed crystals are arranged such that exposed surfaces of adjacent ones of the starting group-III nitride seed crystals make an angle greater than 0 degrees and less than 180 degrees with respect to each other.

23. The method of claim 16, wherein the group-III nitride crystal contains a different concentration of defects than the starting group-III nitride seed crystal.

24. The method of claim 16, wherein the group-III nitride crystal contains a different concentration of impurities than the group-III nitride starting seed crystal.

25. The method of claim 16, wherein the group-III nitride crystal contains a different concentration of chemical species than the starting group-III nitride seed crystal.

26. The method of claim 16, wherein the group-III nitride crystal has a different concentration of free carriers than the starting group-III nitride seed crystal.

27. The method of claim 16, wherein the group-III nitride crystal has a different absorption coefficient for at least one wavelength than the starting group-III nitride seed crystal.

28. The method of claim 16, wherein the group-III nitride crystal has a larger radius of curvature for certain crystallographic planes than the starting group-III nitride seed crystal.

29. The method of claim 16, wherein the group-III nitride crystal has a higher crystal quality than the starting group-III nitride seed crystal.

30. The method of claim 16, wherein the group-III nitride crystal has fewer grains than the starting group-III nitride seed crystal.

31. The method of claim 16, wherein the group-III nitride crystal is grown with a larger growth rate than the starting group-III nitride seed crystal after extended growth in the same environment.

* * * * *